(12) United States Patent
Mihalka

(10) Patent No.: US 6,885,175 B2
(45) Date of Patent: Apr. 26, 2005

(54) FIXED FREQUENCY HYSTERETIC REGULATOR

(75) Inventor: Alex Mihalka, Livermore, CA (US)

(73) Assignee: International Rectifier Corporation, El Segundo, CA (US)

( * ) Notice: Subject to any disclaimer, the term of this patent is extended or adjusted under 35 U.S.C. 154(b) by 4 days.

(21) Appl. No.: 10/693,701

(22) Filed: Oct. 24, 2003

(65) Prior Publication Data

US 2004/0135563 A1 Jul. 15, 2004

Related U.S. Application Data

(60) Provisional application No. 60/421,453, filed on Oct. 25, 2002.

(51) Int. Cl.$^7$ ................................................. G05F 1/40
(52) U.S. Cl. ......................................................... 323/282
(58) Field of Search ................................ 323/280, 282, 323/283, 284, 351

(56) References Cited

U.S. PATENT DOCUMENTS

| | | | |
|---|---|---|---|
| 3,660,753 A | 5/1972 | Judd et al. ................ | 323/22 T |
| 4,392,103 A | 7/1983 | O'Sullivan et al. ......... | 323/222 |
| 4,437,146 A | 3/1984 | Carpenter .................... | 363/21 |
| 4,529,927 A | 7/1985 | O'Sullivan et al. ......... | 323/222 |
| 4,929,882 A | 5/1990 | Szepesi ....................... | 323/222 |
| 5,345,165 A | 9/1994 | Froeschle ................... | 323/284 |
| 5,734,259 A | 3/1998 | Sisson et al. ................ | 323/282 |
| 6,147,478 A | 11/2000 | Skelton et al. ............... | 323/288 |
| 6,348,780 B1 | 2/2002 | Grant .......................... | 323/222 |
| 6,433,525 B2 * | 8/2002 | Muratov et al. ............. | 323/282 |
| 6,456,050 B1 | 9/2002 | Agiman ....................... | 323/282 |
| 6,791,306 B2 * | 9/2004 | Walters et al. .............. | 323/288 |

OTHER PUBLICATIONS

Analog Devices, Inc., Multiphase IMVP–IV Core Controller for Mobile CPUs ADP3205, pp. 1–24; www.analog.com, 2003.

Texas Instruments, Inc., TPS5211 High Frequency Programmable Hysteretic Regulator Controller, pp. 1–32, Sep., 1999.

* cited by examiner

*Primary Examiner*—Adolf Berhane
(74) *Attorney, Agent, or Firm*—Ostrolenk, Faber, Gerb & Soffen, LLP

(57) ABSTRACT

A control circuit for controlling a hysteretic regulator to operate at substantially fixed frequency has a voltage offset circuit which receives a first feedback signal and generates a pair of upper and lower offset voltages; a control reference stage which receives a reference voltage and the upper and lower offset voltages and outputs upper and lower control reference voltages; and a window comparator which receives the upper and lower control reference voltages and an output voltage feedback signal and outputs a pair of upper and lower control voltages for controlling switching of the hysteretic regulator at a fixed frequency. The first feedback signal may be representative of a switching frequency, a temperature or an output voltage of the hysteretic regulator, for example. The voltage offset circuit may further receive a second and/or an additional feedback signal. The first, second and/or additional feedback signals further may be weighted. According to particularly useful embodiments of the invention, the control method for a hysteretic regulator may use both output voltage and switching frequency as primary feedback signals, thereby allowing the window limits (control voltages) to be positioned completely independently and in any possible configuration about the nominal voltage. In other words, the two window limits can be positioned symmetrically or asymmetrically about the nominal voltage, and at the same time the lower window limit can be positioned either below, above, or equal to the upper window limit.

30 Claims, 6 Drawing Sheets

FIXED FREQUENCY HYSTERETIC REGULATOR

CROSS-REFERENCE TO RELATED APPLICATION

This application is based upon and claims priority of the applicant's U.S. Provisional Application Ser. No. 60/421,453 filed Oct. 25, 2002, incorporated by reference.

BACKGROUND OF THE INVENTION

1. Field of the Invention

The invention relates to high frequency switching power supplies, and more particularly to a hysteretic regulator adapted for maintaining a constant switching frequency in a switching power supply.

2. Background Art

High frequency switching power supplies are controlled or regulated by several different control schemes. The advantages of some methods are the disadvantages of others, and vice versa. To date no control scheme retains all the advantages of all the popular methods, while eliminating the disadvantages, of these methods. Desirable attributes of a switching regulator include immediate response, inherent power supply stability, and fixed frequency. There is a need for an improved regulator providing more of these attributes.

Hysteretic Regulator—Historically, the earliest control method for a switching power supply was known as the hysteretic regulator, wherein the output signal was fed back to the inputs of a window comparator, with upper and lower limits Vmax and Vmin, respectively. In the steady state, the feedback signal is maintained within the upper and lower bounds of the window. Other names for this control method are the "Constant Ripple Regulator", since the output ripple is constant and equal to Vmax−Vmin, and the "Bang-Bang" regulator, since the regulator reacts to the feedback signal by controlling the main switch on or off, causing the output to bounce around between the window limits. A desirable feature of the hysteretic regulator is that it is fast responding and inherently stable, requiring no compensation of the feedback signal. Curing stability problems can be quite challenging, and the inability to solve the compensation network correctly has caused many otherwise good designs to become unworkable.

However, due to the nature of how output voltage ripple is determined and to the dependence of this ripple on the relative magnitudes of the input and output voltages, the frequency of operation of the hysteretic regulator must change with input voltage. This is the most significant drawback of the hysteretic regulator, since input filtering must be determined based on the lowest frequency of operation, corresponding to the lowest Vin. The input filter requires physically larger components with decreasing Vin, and the filter becomes wasted space and cost at higher Vin. Some claim to have observed circuit subharmonic oscillations with hysteretic regulators, causing noise and interference with sensitive control signals.

The operation of the standard hysteretic regulator can be explained by the ideal waveforms in FIG. 1. Shown are the ripple voltages for two different values of Vin and a set value of Vout for a buck regulator, which is a typical application for this regulator. (The invention described herein applies to any switching regulator; the buck regulator is chosen as an example.) In FIG. 1, Vmax−Vmin is fixed, and f is variable. The nominal value of the output voltage is a line that is midway between the upper and lower bounds of each window and is labeled Vnom.

The time it takes the lower waveform to traverse upward through the window is shorter than that of the upper waveform because the input voltage in the upper waveform is lower. The slope of this part of the waveform is to the first order proportional to the difference between the input and output voltages. In both cases the downward slope of both waveforms is the same, since the slope during this part of the waveform is independent of Vin, and Vout is the same in both cases. With a set Vmax−Vmin, the time it takes to traverse the window in the downward direction is therefore the same in both cases. The difference in the upwards transition time results in different periods Ts1 and Ts2, and different switching frequencies, dependent upon Vin. Typically, switching frequencies can vary by ratios of between 6:1 and 10:1.

PWM Regulator—The most common control method used in today's high frequency switching power supplies is pulse width modulation, wherein the pulse width of the switch connecting the input to the output is varied (modulated) to provide the desired output voltage. Operation of the typical pulse width modulator, or PWM, is shown in FIG. 2, again for a buck regulator as an example, where the period T starts at time $t_0$, f is fixed, and pulse width is variable. As Vin changes, the falling edge (or leading edge, in a leading edge blanking system) of the pulse width moves, regulating the output voltage to the desired amount. The arrows in FIG. 2 on the falling edges of the pulses signify the moving edges of the pulses. With Vin stable, this edge is automatically adjusted to compensate for changes in temperature and conduction losses due to load. The input voltage of the upper waveform in FIG. 2 is less than the input voltage of the lower waveform, since it takes a longer pulse width (and thus more time for energy transfer) to regulate the output. The period is the same for all cases of Vin and load variation in a PWM.

Although fixed frequency is a desirable characteristic in a regulator, the PWM has its disadvantages. Most importantly, the response time of the control circuit is compromised in that it must be slowed down to prevent circuit instabilities. As mentioned above, the required circuitry can be challenging. Without slowing down the response, wild oscillations of the output voltage can result, and the output may never become stable. The technique used to correct this problem is to provide feedback compensation, and a typical compensation network is provided in the feedback network around the error amplifier, as shown in FIG. 3. The output Verror of this function block will amplify and delay signals from the feedback signal Vfb due to the resistors and capacitors in the feedback path. This intentional delay is inserted to provide stability to the system.

The PWM's advantage is fixed frequency, which is not achievable with the basic hysteretic regulator. The hysteretic regulator's advantage is fast response and inherent stability, which is not possible in the PWM without compromise. What is desired is a regulator that retains the advantages of both regulators, and which will by default eliminate the disadvantages of both regulators. In summary, the characteristics desired in this regulator are fast response (hysteretic regulator), inherent electrical stability (hysteretic regulator), and fixed frequency (PWM).

Several modifications to the hysteretic regulator have been made by others attempting to obtain these characteristics.

It has been attempted to keep the frequency constant in a hysteretic regulator by adjusting the window. One method involves using feedforward of the input voltage. This keeps f relatively constant, but suffers from nonlinearity over the range of Vin, and the input filter must be determined using the worst case operating condition.

Another method keeps f constant over the midrange of duty cycle D, but the frequency changes significantly outside this range. Further, the range of variable frequency is typically in the operating region of today's buck regulators for many significant high volume applications. This method is used in the Texas Instruments TPS 5211 Hysteretic Regulator Controller, described at http://www-s.ti.com/sc/ds/tps5211.pdf.

In another method, used in the Analog Devices ADP 3205 Core Controller, output ripple is dependent upon the ESR of the output capacitor and the absolute value of the output inductor. Both of these quantities change with temperature, and the output capacitor ESR can change with age, depending upon the type of capacitor used. In addition, the capacitor ESR changes with operating frequency. Analog Devices has a method of correcting for variances in ESR, but this method does not compensate for changes in Vin. See the description of the ADP3205, especially FIG. 4, at http://www.anatog.com/productSelection/pdf/ADP3205_prj.pdf.

SUMMARY OF THE INVENTION

Fixed Frequency Hysteretic Regulator—The invention provides the fast response and inherent stability of the hysteretic regulator along with the fixed frequency characteristic of the pulse width modulator, while eliminating the main disadvantages of both regulators—the variable frequency of the hysteretic regulator and the compensation network required for stability of the PWM. The result can be called a Fixed Frequency Hysteretic Regulator (FFHR).

According to particularly useful embodiments of the invention, the control method for a hysteretic regulator may use both Vout and switching frequency as primary feedback signals, which allows the window limits to be positioned completely independently and in any possible configuration about the nominal voltage. In other words, the two window limits can be positioned symmetrically or asymmetrically about the nominal voltage, and at the same time the lower window limit can be positioned either below, above, or equal to the upper window limit.

According to one aspect of the invention, a control circuit for controlling a hysteretic regulator to operate at substantially fixed frequency comprises: a voltage offset circuit which receives a switching frequency feedback signal and an output voltage feedback signal from said hysteretic regulator and generates a pair of upper and lower offset voltages; a control reference stage which receives a reference voltage and said upper and lower offset voltages and outputs upper and lower control reference voltages; and a window comparator which receives said upper and lower control reference voltages and said output voltage feedback signal and outputs a pair of upper and lower control voltages for controlling switching of said hysteretic regulator at a fixed frequency. The voltage offset circuit preferably comprises at least a frequency/voltage converter which receives said frequency feedback signal. A resistive network may be connected to said voltage offset circuit for delivering said upper and lower offset voltages to said control reference stage, and/or for delivering said reference voltage to said control reference stage. The upper and lower control voltages may be positioned symmetrically or asymmetrically about a nominal voltage. The upper control voltage may be positioned higher than, lower than, or substantially equal to the lower control voltage.

According to another aspect of the invention, a control circuit for controlling a hysteretic regulator to operate at substantially fixed frequency comprises: a voltage offset circuit which receives a first feedback signal and generates a pair of upper and lower offset voltages; a control reference stage which receives a reference voltage and said upper and lower offset voltages and outputs upper and lower control reference voltages; and a window comparator which receives said upper and lower control reference voltages and an output voltage feedback signal and outputs a pair of upper and lower control voltages for controlling switching of said hysteretic regulator at a fixed frequency. The control circuit may receive a second feedback signal and/or an additional feedback signal as well. The feedback signals may be representative of a switching frequency, an output voltage, or a temperature of said hysteretic regulator, for example. Circuitry may be provided for weighting the first, second and/or additional feedback signals. The voltage offset circuit preferably comprises at least a frequency/voltage converter which receives said frequency feedback, signal. A resistive network may be connected to said voltage offset circuit for delivering said upper and lower offset voltages to said control reference stage, and/or for delivering said reference voltage to said control reference stage. The upper and lower control voltages may be positioned symmetrically or asymmetrically about a nominal voltage. The upper control voltage may be positioned higher than, lower than, or substantially equal to the lower control voltage.

Other features and advantages of the present invention will become apparent from the following description of embodiments of the invention which refers to the accompanying drawings, in which like references denote like elements and parts.

DETAILED DESCRIPTION OF EMBODIMENTS OF THE INVENTION

The characteristics of the FFHR can be accomplished by any number of circuit solutions. According to one aspect of the invention, a hysteretic regulator may have a means of actively varying the window height depending upon circuit conditions. The window will be centered about some portion (depending on the reference voltage of the feedback comparator) of the desired dc output level as in a standard hysteretic regulator. However, instead of the control loop varying the pulse width (horizontal direction, or time base) as in the PWM regulator, the window voltage Vmax–Vmin will be varied (vertical direction, or ripple voltage value). The maximum window variation can be established based on specifications and circuit parameters, including an absolute maximum window voltage specification and a minimum output capacitance ESR. These specifications may be realized in the circuit straightforwardly with a few passive components such as low power resistors. The output falls within certain bounds under all steady state operating conditions. With slow changes in circuit conditions, as occurs with temperature variation, the window adjusts accordingly such that the switching frequency f is brought back to the desired setting. As Vin changes, the window also adjusts to the proper value to keep f constant. Usually Vin does not rapidly change, although the FFHR can be made to rapidly respond to this case as well.

Figure 4:
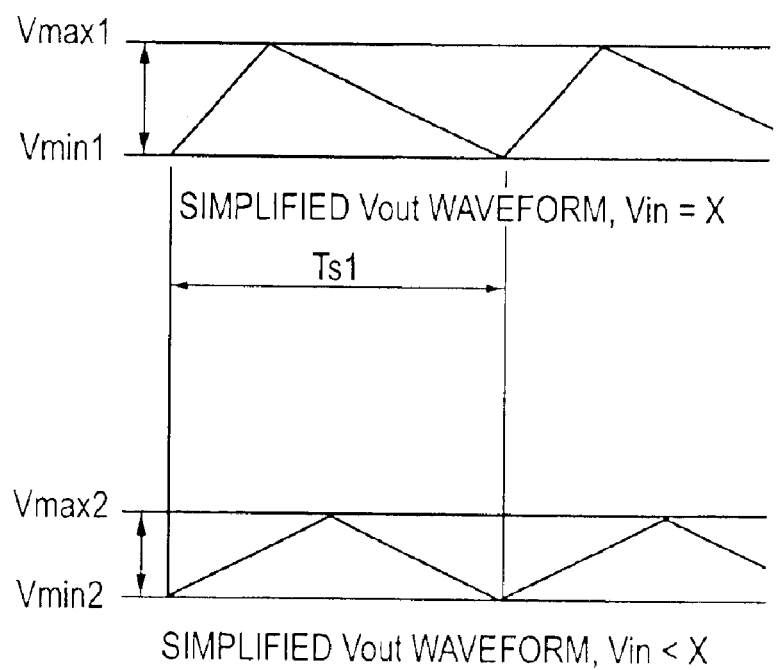
FIG. 4 is a diagram showing output waveforms in a fixed frequency hysteretic control circuit according to an embodiment of the invention.

FIG. 4 shows the output ripple voltage and shows how the window varies in the FFHR. The upper waveform shows a steeper upslope than the lower waveform, signifying a higher input voltage in the case of the upper wafeform. To keep the switching period Ts1 constant the same as the input voltage decreases, the window Vmax–Vmin is made narrower. Notice that the downslope is the same for both cases, and that the upslope portion occurs for a longer period of time for lower Vin.

How quickly the window changes is not critical, since it is believed that the output will stay within acceptable bounds under any conditions and will always have instant response to any output voltage excursions outside the window.

However, it is believed that a sudden, large change in operating conditions may bring a change in switching frequency before the window is properly adjusted to bring f back to its desired value. But since electromagnetic compatibility (EMC) is measured under steady state conditions, the input filters can be designed for the nominal switching frequency.

Figure 5:
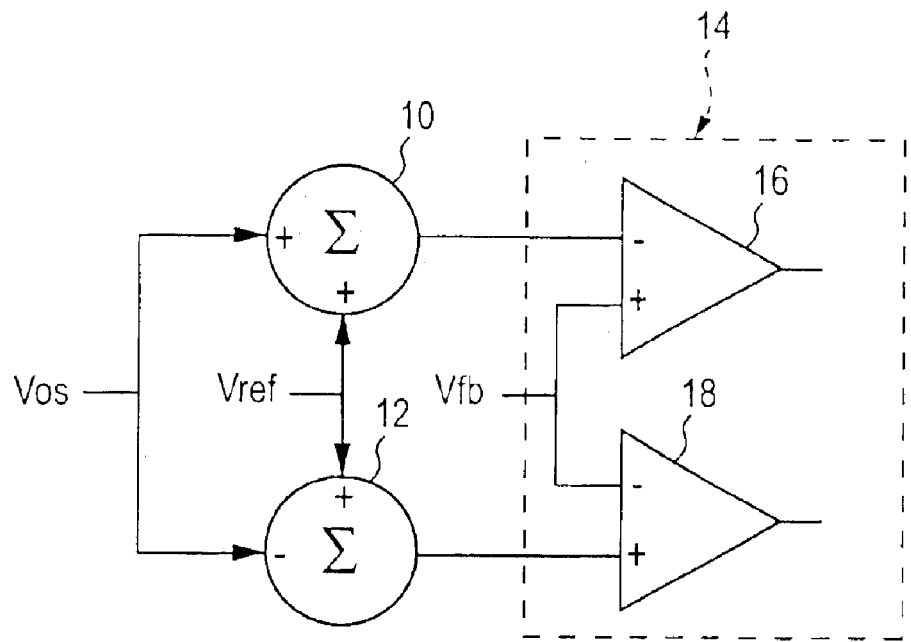
FIG. 5 is a simplified schematic diagram of a conventional hysteretic control circuit.

A control circuit for a conventional hysteretic regulator is shown in FIG. 5. A reference voltage Vref sets the nominal output voltage. An offset voltage Vos, which is typically a fixed voltage, is added to and subtracted from Vref by the summers 10 and 12. The outputs thereof become the upper and lower reference voltages supplied to the window comparator 14, and are compared respectively against the feedback voltage Vfb by differential amplifiers 16 and 18. The outputs of the window comparator 14 control the main switch of the conventional hysteretic regulator.

Figure 6:
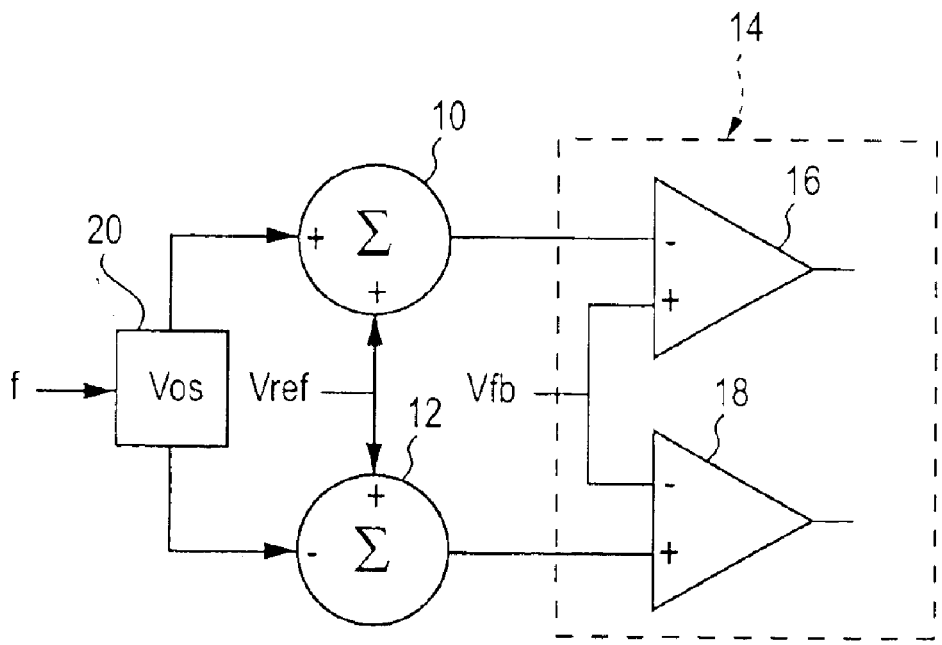
FIG. 6 is a simplified schematic diagram of a hysteretic control circuit according to an embodiment of the invention.

A basic control circuit embodying the invention can be realized by the circuit of FIG. 6. The difference between this circuit and the control circuit of FIG. 5 is that switching frequency f is fed back and used for adjusting the offset voltage Vos in an offset voltage circuit 20 to vary the window limits and thereby obtain constant switching frequency.

Figure 1:
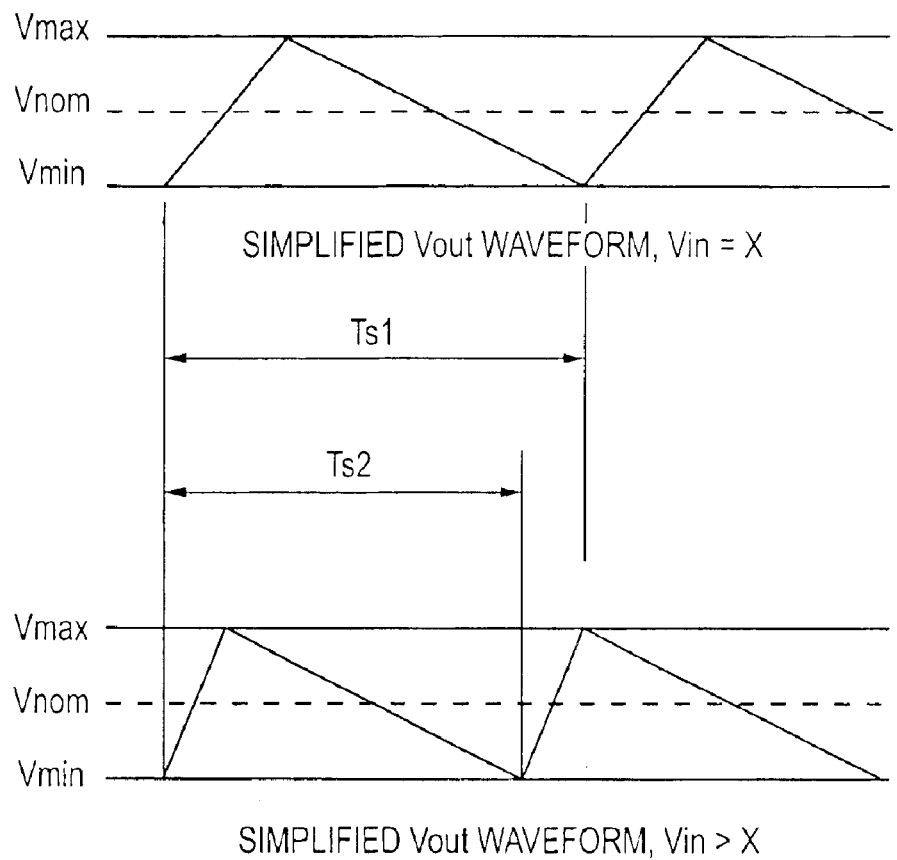
FIG. 1 is a diagram showing output waveforms in a conventional hysteretic control circuit.
Figure 2:
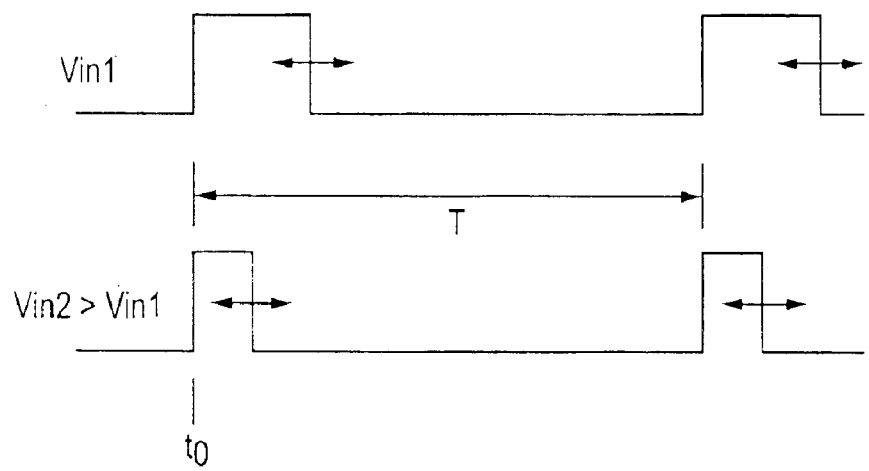
FIG. 2 is a diagram showing output waveforms in a conventional PWM control circuit.
Figure 3:
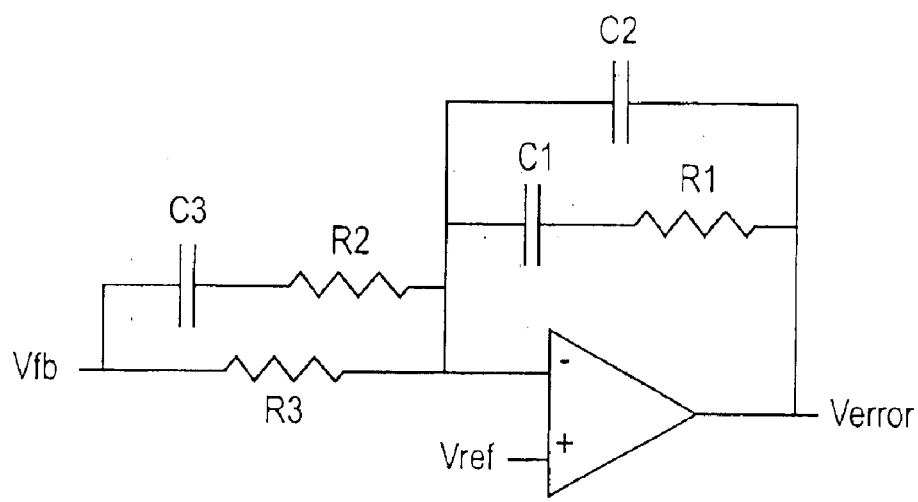
FIG. 3 is a schematic diagram showing a compensation network in a conventional PWM control circuit.
Figure 7:
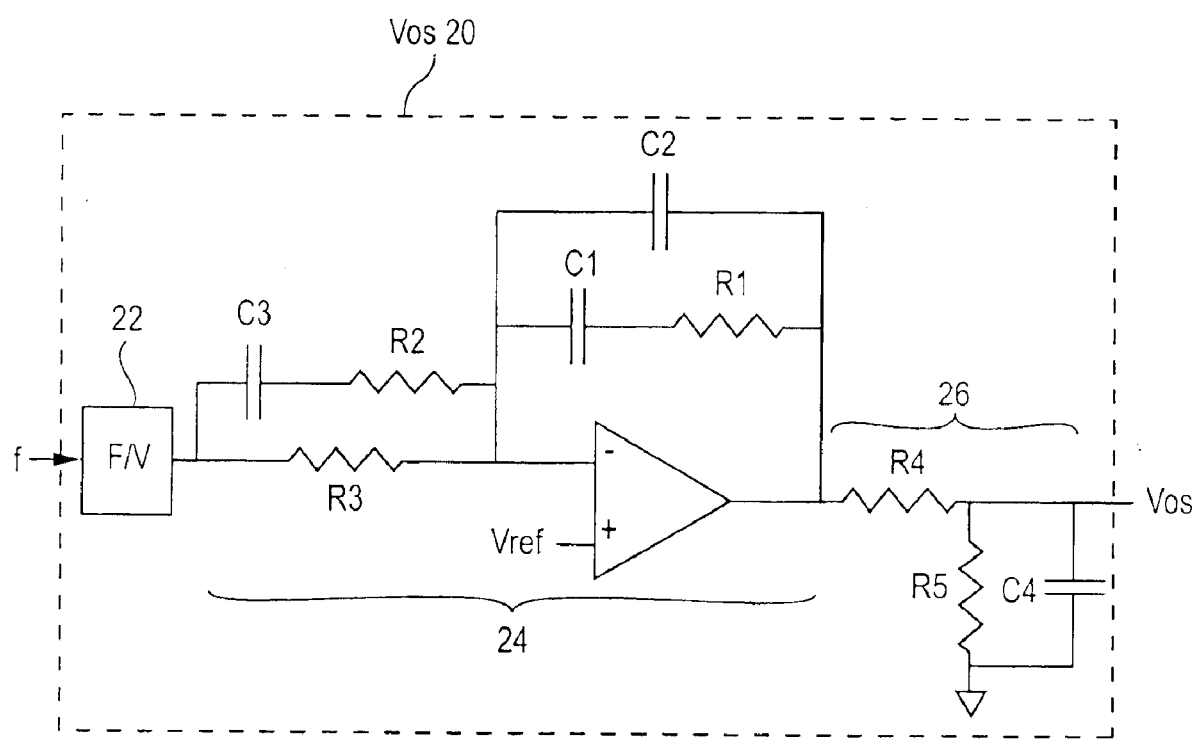
FIG. 7 is a schematic diagram of the offset voltage circuit in the embodiment of FIG. 6.

One way to implement the Vos circuit 20 is shown in FIG. 7. In FIG. 7, a frequency-to-voltage converter 22 is combined with the circuit of FIG. 3, the standard error amplifier 24 of a PWM regulator, and an RC output filter 26. The F/V converter is a well-known concept and either a simple implementation or a precise version may be freely selected, depending on desired accuracy. The design of the Vos 20 is flexible, in that the change in offset voltage can be immediate or can be delayed on the order of seconds, if desired, since the hysteretic regulator is inherently stable. Either or both of the building blocks 24, 26 following the F/V converter in the Vos 20 may be unnecessary if the F/V converter is designed with sufficient inherent delay.

It should be noted that the invention is not limited to feedback of frequency only. For example, temperature T may be fed back, which would adjust the switching frequency to achieve constant component temperature. This would be advantageous when reliability is the most important parameter. Also, the offset voltage Vos may have more than one control input, such as both f and T, which further may be weighted if desired.

Figure 8:
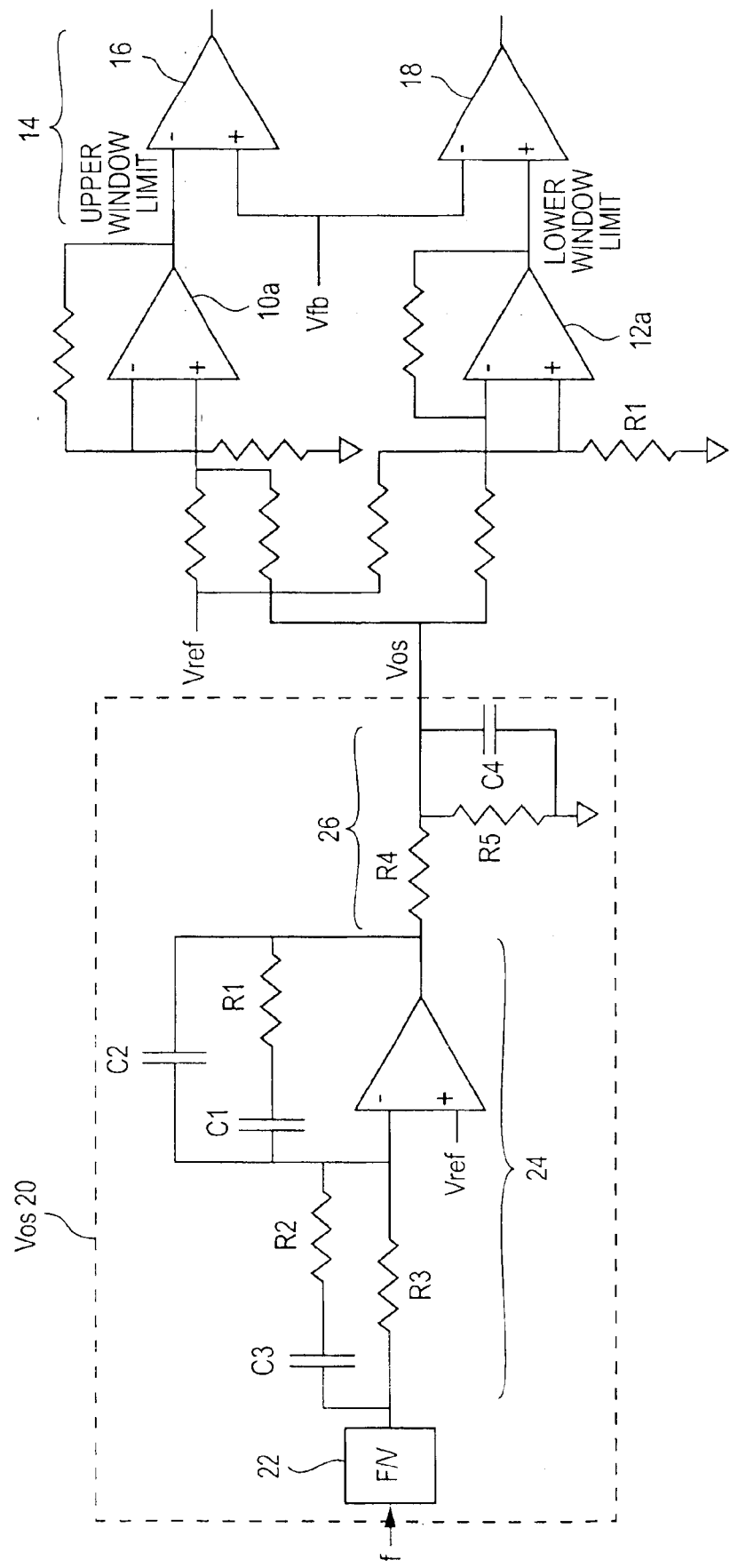
FIG. 8 is a schematic diagram of a hysteretic control circuit according to another embodiment of the invention.

A basic implementation of the FFHR in FIG. 6 is shown in FIG. 8. The Vos circuit 20 is as shown in FIG. 7. The resistance values in the resistive input and feedback networks of the differential amplifiers 10a and 12a can easily be selected by the skilled individual to get acceptable results.

Figure 9:
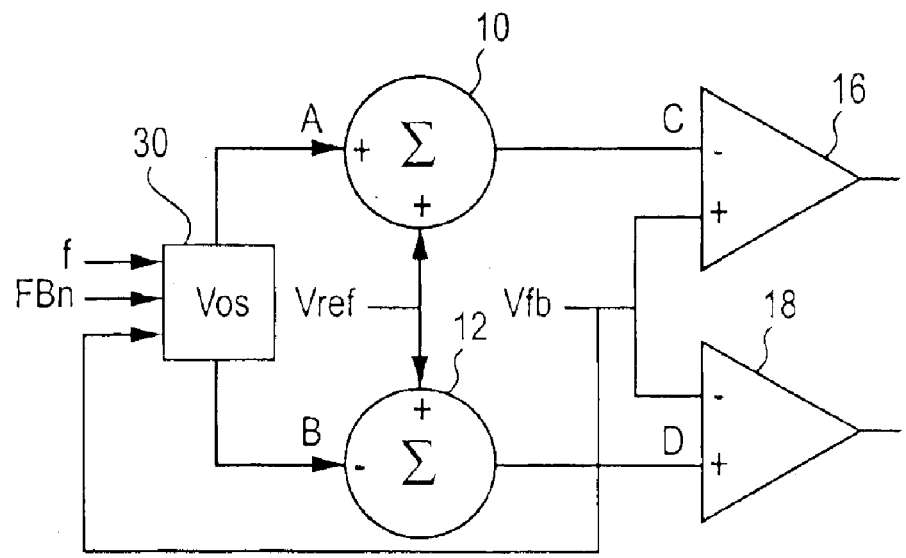
FIG. 9 is a schematic diagram of a hysteretic control circuit according to yet another embodiment of the invention.

Improved Hysteretic Regulator with Completely Independent Window Limits—The circuit of FIG. 6 can be improved by allowing the upper and lower limits of the window to be adjusted completely independently of each other. FIG. 9 shows a general block diagram in which the voltage offset circuit Vos 30 is supplied with the frequency f, the feedback signal Vfb and other feedback signals (FBn) as well, allowing the signals at points A and B to be different in value. Providing this capability compensates for unequal throughput delays of the IC and the circuit switches. While the window outputs at C and D can be asymmetrical about the reference voltage, the output ripple will be symmetrical about the regulated output voltage because the circuit automatically compensates for delay imbalances to regulate the output and at the same time keep f constant.

Figure 10:
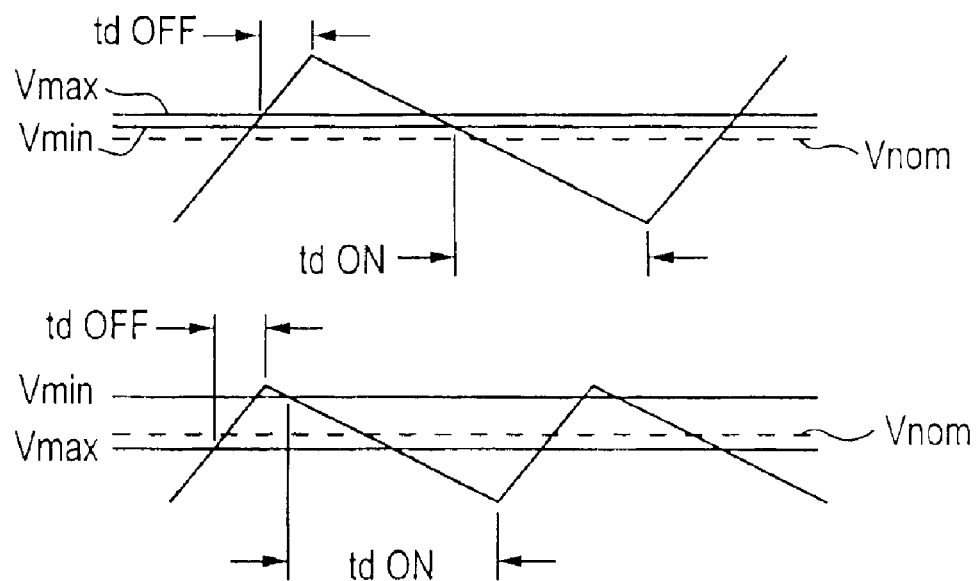
FIG. 10 is a diagram showing output waveforms in the control circuit of FIG. 9.

In addition to the window offsets being asymmetrical, they can further be allowed to cross each other; that is, the upper limit can be set to a value equal to or lower than the lower limit. This allows higher frequency operation than hysteretic regulators that are currently available in the marketplace today. See FIG. 10, where the constant on and off delays are shown. The upper waveform switching f is near maximum for the case of Vmax greater than Vmin. Since the delays are the same in any case, the lower waveform switches at a higher frequency because Vmax and Vmin are allowed to cross. Note that the position of Vnom is allowed to fall asymmetrically inside the window, or completely outside the window.

Finally, in an effort to create improved noise immunity, the feedback signal can be amplified such that the Window limits are pushed farther apart. This may also help in achieving higher switching frequency.

Several advantages of the FFHR are as follows:

Faster control loop response in a switching regulator.

Inherently stable—no compensation needed; simple to design.

Flexible design—changing the number and type of output capacitors (i.e., ceramic, electrolytic, etc.) will not result in unstable operation, and does not require changing a compensation network to regain stability, as is the case with a PWM regulator.

Fixed frequency operation in steady state.

Although f is fixed over the long term, transient excursions outside the window are dealt with immediately, without waiting for a new period to begin as in a PWM regulator. This results in less output capacitance needed for the same droop, and therefore lower cost of the design.

Feedforward of the input voltage can be easily implemented for relatively fast coarse window adjustment during startup and shutdown.

Fine window adjustment with slow response can be made for thermal effects, for conduction drops due to changes in load, and for changes in component parameters due to aging.

FFHR enjoys all major advantages of PWM regulator and standard hysteretic regulators, and is not affected by major disadvantages of these regulators.

FFHR is suitable for systems having wide input voltage ranges such as brick regulators with 4:1 or greater Vin range.

FFHR is appropriate for mobile processors where Vin can vary widely and fast transient response is required.

Switching frequency can be programmed for specific applications, such as varying f inversely with Vin to keep switching losses relatively constant, extending battery life in portable systems.

Adaptable to digital control, where window width and voltage positioning can be controlled digitally.

Feedback signal can be signal other than f (i.e., temperature), or can be a weighted sum of signals.

Window limits can be made completely independent of each other to offset imbalances in control circuit delays and for improved regulation.

Window limits can be made equal or allowed to cross each other, enabling high frequency operation.

Feedback signal can be amplified to expand window size and improve noise immunity.

It is thought that no other control method for a hysteretic regulator uses both Vout and switching frequency as primary feedback signals, which allows the window limits to be positioned completely independently and in any possible configuration about the nominal voltage. In other words, the two window limits can be positioned symmetrically or asymmetrically about the nominal voltage, and at the same time the lower window limit can be positioned either below, above, or equal to the upper window limit.

Although the present invention has been described in relation to particular embodiments thereof, many other variations and modifications and other uses will become apparent to those skilled in the art. Therefore, the present inventions is not limited by the specific disclosure herein.

What is claimed is:

1. A control circuit for controlling a hysteretic regulator to operate at substantially fixed frequency, comprising:
    a voltage offset circuit which receives a switching frequency feedback signal and an output voltage feedback signal from said hysteretic regulator and generates a pair of upper and lower offset voltages;
    a control reference stage which receives a reference voltage and said upper and lower offset voltages and outputs upper and lower control reference voltages; and
    a window comparator which receives said upper and lower control reference voltages and said output voltage feedback signal and outputs a pair of upper and lower control voltages for controlling switching of said hysteretic regulator at a fixed frequency.

2. A control circuit as set forth in claim 1, wherein said control reference stage comprises a first summer which receives said reference voltage and said upper offset voltage, and a second summer which receives said reference voltage and said lower offset voltage; and said first and second summers respectively output said upper and lower control reference voltages.

3. A control circuit as set forth in claim 2, wherein said first summer adds said upper offset voltage to said reference voltage, and said second summer subtracts said lower offset voltage from said reference voltage.

4. A control circuit as set forth in claim 1, wherein said voltage offset circuit comprises a frequency/voltage converter which receives said frequency feedback signal.

5. A control circuit as set forth in claim 4, wherein said voltage offset circuit further comprises an error amplifier in series with said frequency/voltage converter.

6. A control circuit as set forth in claim 5, further comprising an output filter in series with said error amplifier.

7. A control circuit as set forth in claim 4, further comprising an output filter in series with said frequency/voltage converter.

8. A control circuit as set forth in claim 4, further comprising a resistive network connected to said voltage offset circuit for delivering said upper and lower offset voltages to said control reference stage.

9. A control circuit as set forth in claim 8, wherein said resistive network further delivers said reference voltage to said control reference stage.

10. A control circuit as claimed in claim 1, wherein said upper and lower control voltages are positioned symmetrically about a nominal voltage.

11. A control circuit as claimed in claim 1, wherein said upper and lower control voltages are positioned asymmetrically about a nominal voltage.

12. A control circuit as claimed in claim 1, wherein said upper control voltage is positioned higher than said lower control voltage.

13. A control circuit as claimed in claim 12, wherein said upper and lower control voltages are positioned asymmetrically about a nominal voltage.

14. A control circuit as claimed in claim 1, wherein said upper control voltage is positioned lower than said lower control voltage.

15. A control circuit as claimed in claim 14, wherein said upper and lower control voltages are positioned asymmetrically about a nominal voltage.

16. A control circuit as claimed in claim 1, wherein at least one of said upper and lower control voltages is positioned above a nominal voltage.

17. A control circuit as claimed in claim 16, wherein both of said upper and lower control voltages are positioned above said nominal voltage.

18. A control circuit as claimed in claim 1, wherein both of said upper and lower control voltages are positioned below said nominal voltage.

19. A control circuit as claimed in claim 1, wherein said upper and lower control voltages are substantially equal.

20. A control circuit as claimed in claim 10, wherein said upper and lower control voltages are substantially equal.

21. A control circuit for controlling a hysteretic regulator to operate at substantially fixed frequency, comprising:
    a voltage offset circuit which receives a first feedback signal and generates a pair of upper and lower offset voltages;
    a control reference stage which receives a reference voltage and said upper and lower offset voltages and outputs upper and lower control reference voltages; and
    a window comparator which receives said upper and lower control reference voltages and an output voltage feedback signal and outputs a pair of upper and lower control voltages for controlling switching of said hysteretic regulator at a fixed frequency.

22. A control circuit as claimed in claim 21, wherein said first feedback signal is representative of a switching frequency of said hysteretic regulator.

23. A control circuit as claimed in claim 21, wherein said first feedback signal is representative of a temperature of said hysteretic regulator.

24. A control circuit as claimed in claim 21, wherein said voltage offset circuit further receives a second feedback signal.

25. A control circuit as claimed in claim 24, wherein said first and second feedback signals are representative of a switching frequency and a temperature of said hysteretic regulator, respectively.

26. A control circuit as claimed in claim 24, wherein said voltage offset circuit further comprises a circuit for weighting said first and second feedback signals.

27. A control circuit as claimed in claim 24, wherein said second feedback signal is said output voltage feedback signal.

28. A control circuit as claimed in claim 27, wherein said voltage offset circuit further comprises a circuit for weighting said first arid second feedback signals.

29. A control circuit as claimed in claim 24, wherein said voltage offset circuit further receives at least one additional feedback signal.

30. A control circuit as claimed in claim 29, wherein said voltage offset circuit further comprises a circuit for weighting said first, said second, and said additional feedback signals.

* * * * *